(12) United States Patent
Ice et al.

(10) Patent No.: US 7,717,627 B2
(45) Date of Patent: May 18, 2010

(54) ELECTRICAL COMPONENT CONNECTOR WITH MISALIGNMENT COMPENSATION

(75) Inventors: Donald A. Ice, Milpitas, CA (US); Dev Kumar, San Mateo, CA (US); Rudy Hofmeister, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 147 days.

(21) Appl. No.: 10/852,991

(22) Filed: May 25, 2004

(65) Prior Publication Data

US 2005/0141819 A1 Jun. 30, 2005

Related U.S. Application Data

(60) Provisional application No. 60/533,006, filed on Dec. 29, 2003.

(51) Int. Cl.
*G02B 6/36* (2006.01)
(52) U.S. Cl. ...................................................... 385/88
(58) Field of Classification Search .................... 385/33
See application file for complete search history.

(56) References Cited

U.S. PATENT DOCUMENTS

| | | | | | |
|---|---|---|---|---|---|
| 4,979,787 | A | * | 12/1990 | Lichtenberger | ............... 385/88 |
| 5,717,556 | A | * | 2/1998 | Yanagida | .................... 361/803 |
| 5,929,517 | A | * | 7/1999 | Distefano et al. | ........... 257/707 |
| 6,726,504 | B2 | * | 4/2004 | Fuerst et al. | ................. 439/496 |
| 6,754,406 | B2 | * | 6/2004 | Kaneshiro et al. | .............. 385/14 |
| 6,792,171 | B2 | * | 9/2004 | Hargis et al. | .................... 385/14 |
| 7,298,030 | B2 | * | 11/2007 | McWilliams et al. | ........ 257/680 |
| 2003/0063872 | A1 | * | 4/2003 | Govan Date et al. | ........... 385/92 |
| 2003/0173663 | A1 | * | 9/2003 | Kami et al. | .................. 257/728 |
| 2003/0228088 | A1 | * | 12/2003 | Liu | ............................. 385/16 |
| 2005/0194663 | A1 | * | 9/2005 | Ishimura | ..................... 257/666 |

OTHER PUBLICATIONS www.vulcanelectric.com.*

* cited by examiner

*Primary Examiner*—Frank G Font
*Assistant Examiner*—Erin D Chiem
(74) *Attorney, Agent, or Firm*—Workman Nydegger

(57) ABSTRACT

A transceiver module is provided that includes an optical subassembly having an extension with traces corresponding to traces defined on an associated transceiver substrate. A connector element including a flexible, non-electrically conductive substrate within which is disposed an array of conductors is placed between overlapping portions of the extension and the transceiver substrate so that upper ends of some of the conductors contact the traces of the extension, while lower ends of those same conductors contact the corresponding traces of the transceiver substrate. In this way, the connector element provides electrical communication between the optical subassembly and transceiver substrate, while also accommodating misalignment that may be present, or develop, in the transceiver module components.

7 Claims, 4 Drawing Sheets

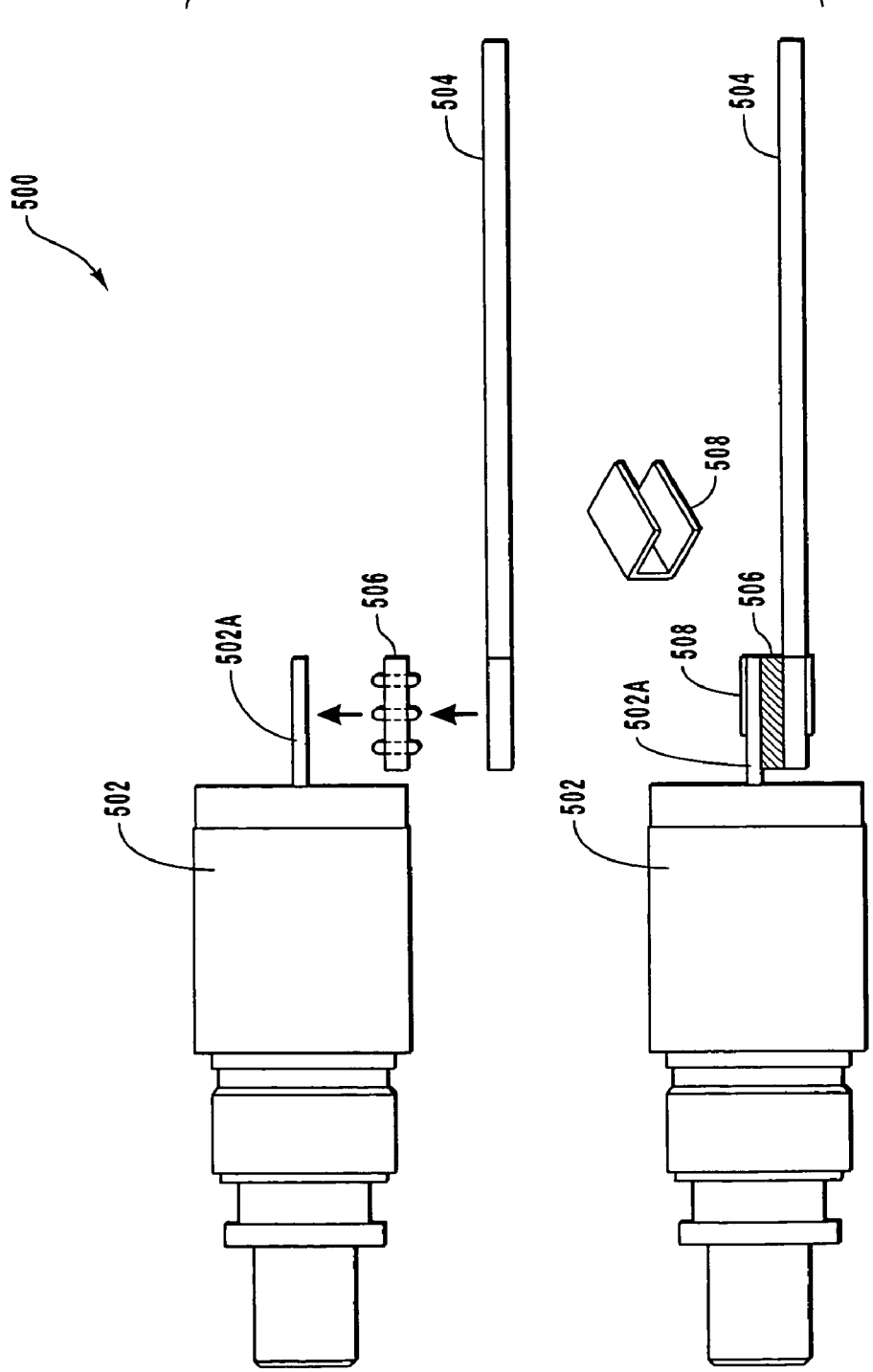

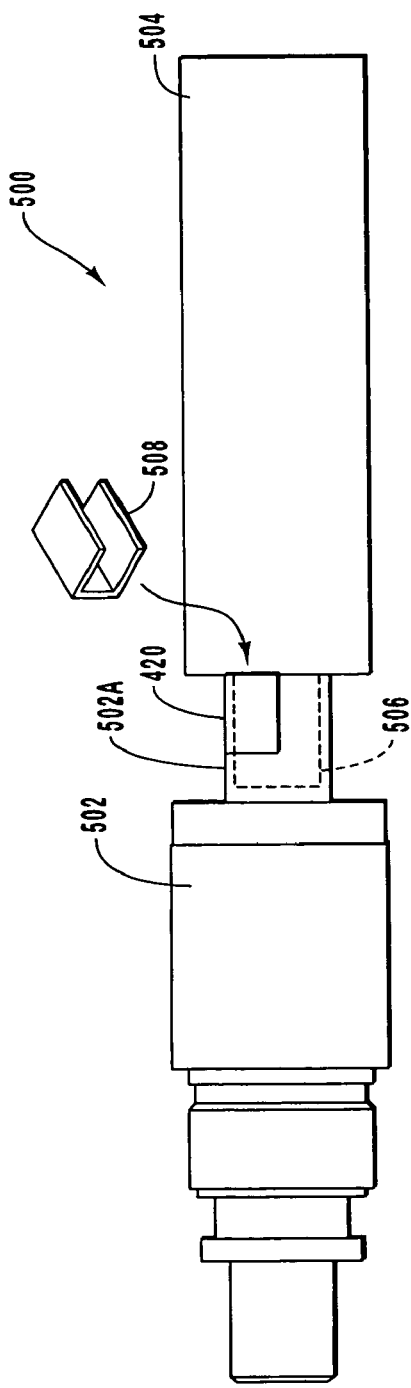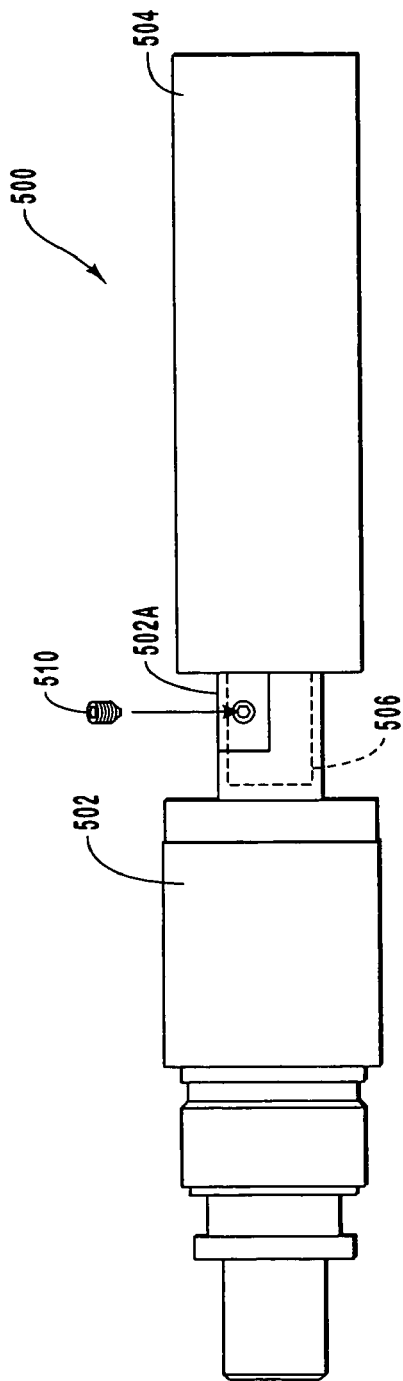
FIG. 4B
FIG. 4C

ELECTRICAL COMPONENT CONNECTOR WITH MISALIGNMENT COMPENSATION

CROSS-REFERENCE TO RELATED APPLICATIONS

The present application claims the benefit of priority to U.S. Provisional Patent Application No. 60/533,006, filed on Dec. 29, 2003, entitled "ELECTRICAL COMPONENT CONNECTOR WITH MISALIGNMENT COMPENSATION", the entire contents of which are incorporated herein by reference.

BACKGROUND OF THE INVENTION

1. The Field of the Invention

The present invention relates generally to electrical connectors. More specifically, exemplary embodiments of the present invention relate to electrical connectors for use with optical subassemblies and printed circuit boards.

2. Related Technology

Fiber optic technology is increasingly employed as a method by which information can be reliably transmitted via a communications network. Networks employing fiber optic technology are known as optical communications networks, and are marked by high bandwidth and reliable, high-speed data transmission.

Optical communications networks employ optical transceivers in transmitting information via the network from a transmission node to a reception node. Generally, such optical transceivers implement both data signal transmission and reception capabilities, such that a transmitter portion of a transceiver converts an incoming electrical data signal into an optical data signal, while a receiver portion of the transceiver converts an incoming optical data signal into an electrical data signal.

More particularly, an optical transceiver at the transmission node receives an electrical data signal from a network device, such as a computer, and converts the electrical data signal to a modulated optical data signal using an optical transmitter such as a laser. The optical data signal can then be transmitted in a fiber optic cable via the optical communications network to a reception node of the network. Upon receipt by the reception node, the optical data signal is fed to another optical transceiver that uses a photodetector, such as a photodiode, to convert the received optical data signal back into an electrical data signal. The electrical data signal is then forwarded to a host device, such as a computer, for processing.

Generally, multiple components are designed to accomplish different aspects of these functions. For example, an optical transceiver can include one or more optical subassemblies ("OSA") such as a transmit optical subassembly ("TOSA"), and a receive optical subassembly ("ROSA"). Typically, each OSA is created as a separate physical entity, such as a hermetically sealed cylinder that includes one or more optical sending or receiving components, as well as electrical circuitry for handling and converting the optical signals. Within the optical transceiver, each OSA generally includes electrical connections to various additional components such as a transceiver substrate, sometimes embodied in the form of a printed circuit board ("PCB").

The transceiver substrate can include multiple other active circuitry components particularly designed to drive or handle electrical signals sent to or returning from one or more of the electrically-attached OSAs. Accordingly, such a transceiver substrate will usually include a number of electrical transmission lines with the one or more OSAs. Such connections may include "send" and "receive" data transmission lines for each OSA, one or more power transmission lines for each OSA, and one or more diagnostic data transmission lines for each OSA. These transmission lines are connected between the transceiver substrate and the OSA using different types of electrical connectors, examples of which include an electrical flex circuit, a direct mounting connection between conductive metallic pins extending from the OSA and solder points on the PCB, and a plug connection that extends from the PCB and mounts into electrical extensions from an OSA.

Each of these methods for electrically connecting the OSA with a transceiver substrate implicates various complications relating to matters such as manufacturing processes, and overall cost associated with the device. These, and other, complications become particularly acute in the context of small form factor components. For example, when an OSA has been mounted within a transceiver housing, the spatial relationship of the optical transmit or receive component, as applicable, of the OSA relative to the transceiver housing 160 must closely conform to various predetermined alignment conditions. However, establishment and maintenance of such a spatial relationship may result in a less than optimal or desirable arrangement of other portions of the OSA relative to the transceiver housing and/or relative to the associated transceiver substrate.

With particular reference to small form factor components, small spatial variations of only thousandths of an inch, or mils, at the optical component end of the OSA can create difficulties with the standardized manufacturing process used to electrically connect the opposing end of the OSA to the PCB. As well, small changes to the spatial relationship of the OSA, such as may result from normal system operations occurring over a period of time, can damage or destroy the electrical connection between the OSA and the PCB. Thus, at least some of the difficulties associated with establishing a secure and reliable electrical connection between an OSA and PCB relate to the strict alignment requirements imposed on the various components that make up the optical transceiver.

Accordingly, what is need are electrical connectors that provide for a reliable and secure electrical connection between components such as an OSA and PCB. Further, such electrical connectors should be able to compensate for any misalignment between the OSA and PCB that may occur during assembly or subsequently, without materially compromising the electrical connection therebetween.

BRIEF SUMMARY OF AN EXEMPLARY EMBODIMENT OF THE INVENTION

In general, exemplary embodiments of the present invention relate to a flexible electrical connector that provides a secure and reliable electrical connection between two or more electrical components, while also being configured to compensate for any misalignment of the components without compromising the integrity or performance of the electrical connection.

In one exemplary implementation, an optical transceiver module is provided that includes a transceiver substrate mounted within a transceiver housing, the transceiver substrate including one or more transmission lines configured and arranged for electrical communication with an OSA. Similarly, the OSA exemplarily includes an electrically conductive extension that extends from the main OSA body, and that includes one or more transmission lines configured and arranged for electrical communication with the transmission lines of the transceiver substrate. In this implementation, the transceiver substrate and electrically conductive extension are positioned in an overlapping manner relative to each other, so that a portion of the OSA overlaps the transceiver substrate by some amount.

The exemplary optical transceiver module further includes a flexible electrical connector that exemplarily includes a flexible non-conductive body within which is disposed an array of conductive leads, each of which extend to opposing sides of the non-conductive body. The flexible electrical connector is disposed between the electrically conductive extension and the printed circuit board in such a way that at least some of the conductive leads contact both the transceiver substrate and the extension, thereby enabling electrical communication between the two.

More particularly, the relatively high density of the electrical connector ensures that a suitable electrical communication path is established between the transceiver substrate and the extension, while the flexible body of the connector readily compensates for any misalignment between the two. These, and other, aspects of exemplary embodiments of the invention will become more fully apparent from the following description and appended claims.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 4A is a side view illustrating aspects of the relationships between an OSA, transceiver substrate, associated electrical connector and clamp, and also illustrating aspects of an exemplary assembly sequence;

FIG. 4B is a top view illustrating aspects of the relationships between an OSA, transceiver substrate, associated electrical connector and clamp; and FIG. 4C is a top view illustrating further aspects of the relationships between an OSA, transceiver substrate, associated electrical connector and clamp.

DETAILED DESCRIPTION OF EXEMPLARY EMBODIMENTS OF THE INVENTION

The present invention solves one or more of the foregoing problems in the art by providing a transceiver package that allows for a flexible, low-cost mounting between an optical sub-assembly and a printed circuit board.

Figure 1:
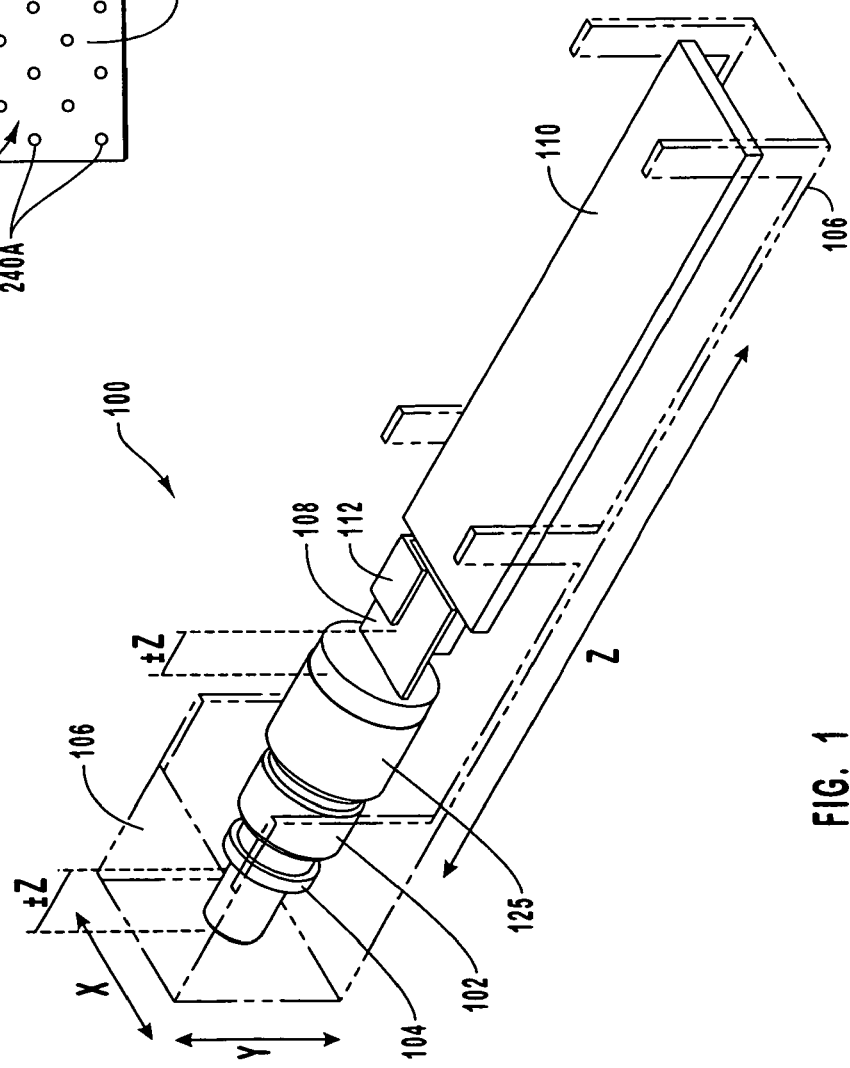
FIG. 1 is a perspective view illustrating aspects of an exemplary optoelectronic module.

With attention first to FIG. 1, details are provided concerning aspects of an exemplary implementation of the invention.

In the illustrated embodiment, an optoelectronic module, such as a transceiver for example, is indicated generally at 100. The optoelectronic module 100 includes one or more optical subassemblies ("OSA") 102 ("OSA"), examples of which include a transmit optical subassembly ("TOSA") and a receive optical subassembly ("ROSA"), that include an optical component 104 which, depending upon the implementation, may comprise an optical transmitter such as a laser, or an optical receiver such as a photodiode. Typically, each OSA 102 is created as a separate physical entity, such as a hermetically sealed cylinder that includes one or more optical sending or receiving components, as well as electrical circuitry for handling and converting the optical signals. The OSA 102 is positioned within a housing 106 such that the optical component 104 is aligned with, for example, an optical transmission fiber.

The OSA 102 also includes an extension 108 that includes traces configured and arranged for electrical communication with corresponding traces of a transceiver substrate 110 by way of a connector element 112, discussed in further detail below. The transceiver substrate 110 is exemplarily implemented as a printed circuit board ("PCB").

Figure 2:
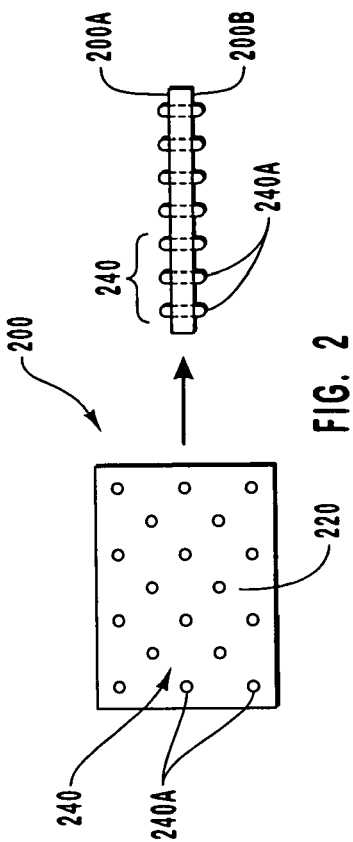
FIG. 2 illustrates aspects of an exemplary flexible electrical connection such as may be employed in connection with embodiments of the invention.

Directing attention now to FIG. 2, further details are provided concerning a connector element 200 such as may be employed in connection with exemplary embodiments of the present invention. Exemplarily, the connector element 200 defines an upper surface 200A and lower surface 200B and comprises a flexible substrate 220 such as a silicone rubber compound. However, any other flexible substrate 220 material of comparable functionality and properties may likewise be employed.

Disposed within the flexible substrate 220 is an array of embedded conductors, denoted generally at 240, and individually at 240A In at least one embodiment, the conductors 240A of the array of conductors 240 consist primarily of a conductive metal, such as gold, although many types of metals and/or related amalgams having suitable conductive properties may alternatively be employed. As suggested in FIG. 1, the geometry and arrangement of the array of conductors 240 within the flexible substrate 220 is such that the opposing ends of each conductor 240A in the array of conductors 240 are at least flush, or above flush, with the opposing sides of the flexible substrate 220.

In at least one embodiment, the conductors 240A are relatively close together, as close as a few microns on center. In addition, each conductor 240A can be spaced roughly equidistant with respect to the next conductor 240A, such that the conductors 240A are disposed substantially uniformly throughout the flexible substrate 220. The array 240 of the conductors 240A within the flexible substrate 220 thus provides the i<flexible substrate 220 with a certain characteristic electrical conductivity.

As suggested by the foregoing, various aspects of the connector element 200 may be adjusted as necessary to suit the requirements of a particular application. For example, aspects of the geometry of the conductors 240A such, but not limited to, the length, and cross-sectional shape and area of the conductors 240A may be varied to suit a particular situation. Moreover, various different conductor 240A configurations may likewise be employed within a single connector element 200.

Further, the number, spacing and orientation of the conductors 240A within the flexible substrate 220 may likewise be modified as necessary. Thus, in some exemplary implementations, the conductors 240A are substantially perpendicular to the upper and lower surfaces 200A and 200B of the connector element while, in other exemplary implementations, the conductors 240A are disposed at an angle with respect to an imaginary axis perpendicular to the upper and lower surfaces 200A and 200B. In one particular implementation, the conductors 240A cooperate with an axis that is perpendicular to the upper and lower surfaces 200A and 200B to define an angle of about 30 degrees. Yet other implementations of the connector element 200 include sets of conductors 240A oriented in a variety of different ways.

Moreover, the electrical characteristics of a given connector element 200 can be readily defined by varying the geometry, type, number, spacing, orientation and/or arrangement of the conductors 240A within the flexible substrate 220. For example, a relatively higher density of conductors 240A within a unit area, also referred to as "pitch," means that a relatively larger number of conductors 240A will be in contact with the opposing traces than would be the case if the pitch of the conductors were relatively lower. Thus, the physical size of the electrical connection and, thus, the amount of current that can be passed, between the traces can be readily defined by selecting a particular pitch.

As the foregoing suggests, implementations and properties of the connector element 200 may vary widely, depending upon the requirements of a particular application. Accordingly, the scope of the invention should not be construed to be limited solely to the exemplary implementations of the connector element 200 disclosed herein.

Figure 3A:
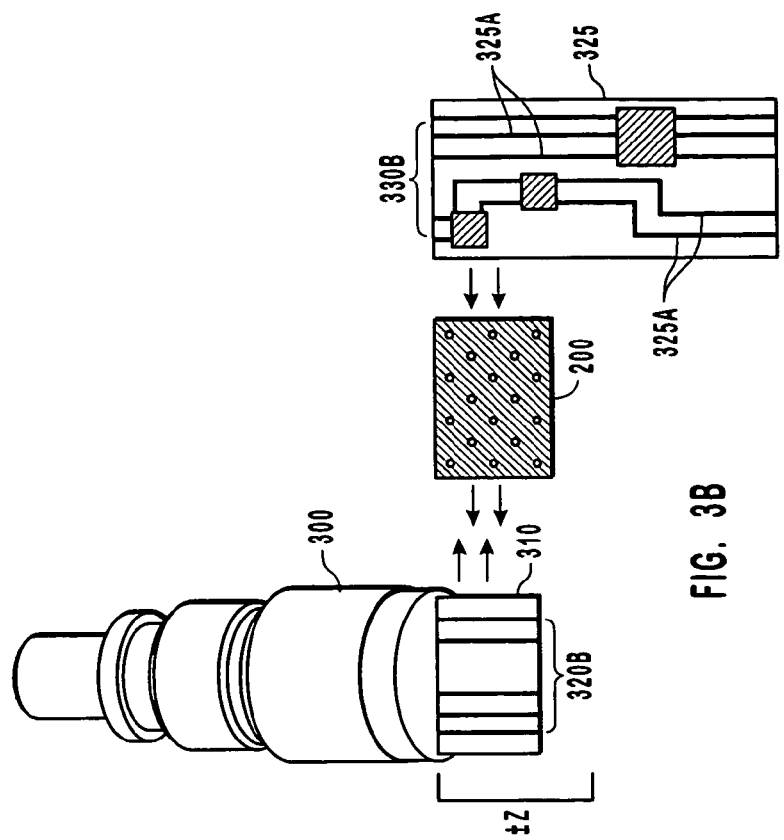
FIG. 3A is a perspective view illustrating aspects of an exemplary arrangement of an OSA, transceiver substrate and associated electrical connector.
Figure 3B:
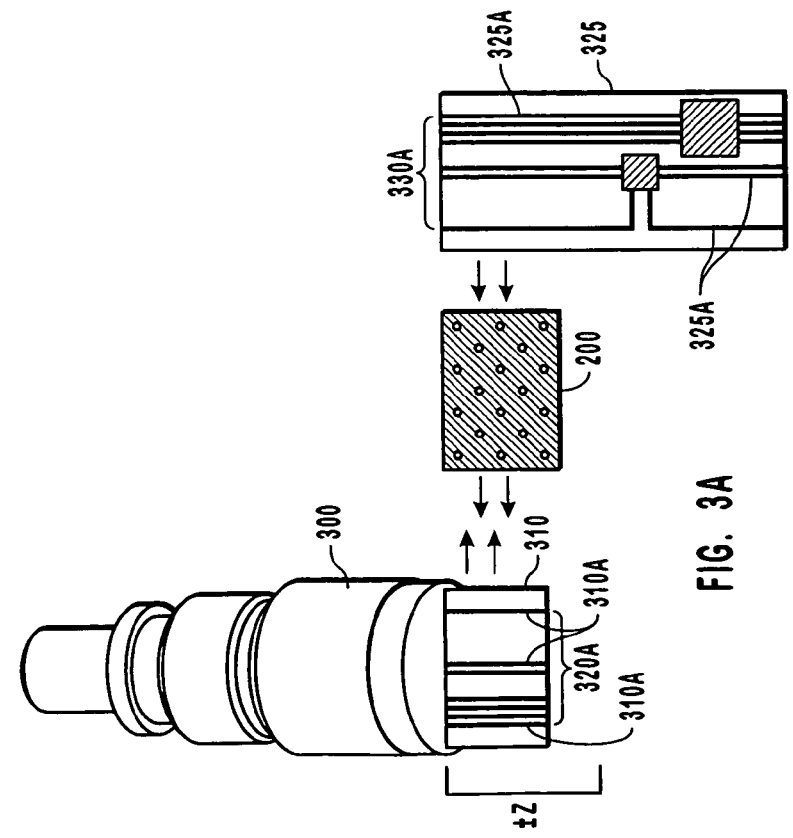
FIG. 3B is a perspective view illustrating aspects of an alternative arrangement of an OSA, transceiver substrate and associated electrical connector.

With reference now to FIGS. 3A and 3B, details are provided concerning an exemplary arrangement of components electrically connected by an embodiment of the connector element 200. In the illustrated arrangement, the connector element 200 is used to electrically connect an OSA 300 having an extension 310 and a transceiver substrate 325, such as a PCB for example. It should be noted that the OSA 300 and transceiver substrate 325 are exemplary components that are suited to be electrically connected by the connector element 200. Accordingly, the scope of the invention is not limited to this particular combination of electrical or optoelectronic components.

In this exemplary implementation, the connector element 200 has a thickness in the range of about 15-20 mils, but other thicknesses may be suitable as well, depending upon the application. In addition, the connector element 200 should generally be sized and arranged to cover the traces on the transceiver substrate 325, as well as the corresponding traces 310A on the extension 310 of the OSA 300, so that electrical communication between the traces 325A of the transceiver substrate 325 and the traces 310A of the extension 310 can be implemented by the array of conductors 240 of the connector element 200. Further details concerning the traces 310A and 325A are provided below.

In at least one embodiment, the connector element 200 is cut from a sheet of material to fit an appropriate set of dimensions such that there is sufficient overlap to accommodate one or more traces 310A on the extension 310 of the OSA 300 and one or more corresponding traces 325A of the transceiver substrate 325. The cutting of the connector element 200 in this way can be performed on a custom, per-component basis, or on a more general mass-manufacturing basis that produces multiple connector elements 200 of a particular size.

With continuing attention to FIGS. 3A and 3B, exemplary trace 310A and trace 325A layouts are illustrated. As suggested there, each of the OSA trace layouts 320A and 320B can be etched in a specific geometric shape or spatial arrangement, as may be dictated by the requirements of a particular application or operating environment. Generally however, the OSA trace layouts 320A and 320B should correspond with, respectively, the trace layouts 330A and 330B of the transceiver substrate 325 such that, for example, the trace layout 320A on the bottom of the extension 310 is substantially a mirror image of the trace layout 330A on the top of the transceiver substrate 325, at least in the region where electrical communication is to be established by the connector element 200. Such a mirror image arrangement helps to ensure that a sufficient number of conductors 240A will be in contact with, and electrically connect, the trace layout 320A and the trace layout 330A.

It should be noted with respect to the foregoing discussion that, for the purposes of clarity, FIGS. 3A and 3B illustrate the underside of embodiments of extension 310 of the OSA 30, and illustrate the top side of embodiments of the transceiver substrate 325. When configured and arranged as shown in FIGS. 3A and 3B then, the OSA 300 and transceiver substrate 325 can be joined together in the exemplary arrangement indicated in FIGS. 3A through 3C, discussed in further detail below.

As suggested in FIGS. 3A and 3B, the trace layouts of the extension 310 and the transceiver substrate 325 can be configured in a wide variety of ways. In at least some implementations of the invention, relatively straight traces at the region where the extension 310 and the transceiver substrate 325 are joined to, or otherwise contact, the connector element 200 contribute to the ease with which the OSA and a transceiver substrate 325 can be electrically connected by the connector element 200. However, any other suitable trace arrangement may alternatively be employed, and the scope of the invention is not limited to the exemplary trace layouts disclosed herein.

Moreover, the extent of overlap between the transceiver substrate 325 and OSA 300 traces can provide an amount of alignment fault tolerance available for mounting an OSA 300 in a transceiver housing of a transceiver module. For example, if a manufacturer etches substantially straight traces 310A on an OSA extension 310 that are roughly 30 mils in length along the Z axis (−) (see FIG. 1), and the manufacturer etches substantially straight corresponding traces 370 on a transceiver substrate 325 that are roughly 30 mils in length on the Z axis (+), there is essentially a slidable overlap zone between the OSA and PCB of up to roughly 30 mils. Thus, the connector element 200, the OSA extension 310, and the connective portion of the transceiver PCB need to be arranged or sized such that when the amount of maximum misalignment is taken into account, a certain minimum area of overlap is guaranteed. This exemplary overlap can provide a significant amount of OSA mounting flexibility, wherein the available alignment tolerances along the Z axis, 60 mils for example, are sufficient to accommodate typical alignment variances, typically in the range of about 10-20 mils, that can occur when an OSA is mounted within a transceiver housing.

In addition, the flexible substrate 220 provide the connector element 200 with the ability to accommodate an amount of X and Y axis (see FIG. 1) variation or misalignment that can occur in the OSA/transceiver housing mounting and/or alignment processes. In particular, the overall thickness compressibility of the connector element 200 allows for a Y axis variation in a range of a few mils. Similarly, the connector element 200 can accommodate a certain amount of X alignment, or side to side, variation, or other X axis changes that can occur during the OSA alignment process, or as a result of normal operations and wear. In this way, the connector element 200 is able to effectively establish electrical communication between components such as the transceiver substrate 325 and OSA 300, while maintaining a certain amount of spatial flexibility along multiple axes and compensating for any misalignment that is present or may occur.

With attention now to FIGS. 4A through 4C, details are provided concerning aspects of an exemplary optoelectronic assembly 500. In the illustrated embodiment, an optoelectronic assembly 502 is provided that is configured and arranged to be electrically connected with a transceiver substrate 504. Exemplarily, the transceiver substrate 504 is configured to electrically communicate with additional optoelectronic modules as well. The optoelectronic assembly 502 may be implemented in various ways such as, but not limited to, a ROSA, TOSA, or optical transceiver that includes both a ROSA and TOSA. As discussed earlier herein in connection with FIGS. 2A and 2B, an OSA, as exemplified by the optoelectronic assembly 502, also includes an electrically conductive extension 502A that extends from the main body of the optoelectronic assembly 502 generally along the Z axis and that includes one or more traces arranged for electrical communication with corresponding traces of the associated transceiver substrate 504.

With particular reference to FIG. 4A, the optoelectronic assembly 502 and transceiver substrate 504 are exemplarily positioned in an overlapping manner relative to each other, such that the extension 502A extends some distance over the transceiver substrate 504. In at least some implementations, the extent to which the extension 502A overlaps the transceiver substrate 504 is determined in part by the spatial orientation of the optoelectronic assembly 502 relative to an associated transceiver housing (see, e.g., FIG. 1). Alternatively, the optoelectronic assembly 502 and transceiver substrate 504 may be electrically coupled to each other prior to alignment of the optoelectronic assembly 502 within the transceiver housing (not shown).

In any event, and with continuing reference to FIG. 4A, the optoelectronic assembly 502 and transceiver substrate 504 are electrically coupled by way of a connector element 506 that, in some implementations, is combined with a clamp 508 or other functionally equivalent structure to comprise an electrical connector system. More particularly, in the embodiment illustrated in FIGS. 4A through 4C, the clamp 508, substantially comprising a metallic material in some embodiments, is sized and configured to fit snugly around the stack comprising the extension 502A, connector element 506, and transceiver substrate 504, as shown.

In some implementations, the clamp 508 is flexibly pressed together to hold the extension 502A, connector element 506, and transceiver substrate 504 tightly together. In some implementations, the clamp 508 is further glued or otherwise attached to the extension 502A and transceiver substrate 504. More particularly, the clamp 508 can be attached to the extension 502A and transceiver substrate 504 using any number of suitable mechanical bonds, such as the screw 510 indicated in FIG. 4C.

In the implementation illustrated in FIG. 4C, the clamp 508 defines a tapped hole configured and arranged to accept a corresponding fastener, such as screw 510 for example. After the clamp 508 has been positioned about extension 502A, connector element 506, and transceiver substrate 504, the screw 510 is inserted into the tapped hole defined by the clamp 508. The clamp 508 is then secured by tightening the screw 510. One aspect of such mechanical connections is that they permit the extension 502A, connector element 506, and transceiver substrate 504 to be readily separated and/or reattached to each other, should the need arise.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module, comprising:
a transceiver substrate including at least one trace;
an optical subassembly including at least one trace that is configured and arranged for at least indirect electrical communication with the at least one trace of the transceiver substrate; and
a connector element at least partially sandwiched between a surface of the transceiver substrate where the at least one trace of the transceiver substrate is disposed and a surface of an extension of the optical subassembly upon which the at least one trace of the optical subassembly is etched, the connector element comprising:
a flexible, substantially non-electrically conductive substrate having first and second opposing sides; and
an array of conductors disposed within the flexible substrate, extending from the first side to the second side opposite to the first side through a width of the flexible substrate, and being distributed substantially uniformly throughout a substantial portion of the flexible substrate, at least one conductor of the array of conductors being in electrical communication with both a trace of the transceiver substrate and a trace of the optical subassembly disposed on opposing sides of the flexible substrate sandwiching the flexible substrate directly between at least a portion of the transceiver substrate and extension, wherein each conductor of the array of conductors extends substantially through upper and lower surfaces of the flexible substrate.

2. The optoelectronic module as recited in claim 1, wherein the optical subassembly comprises one of a transmit optical subassembly; and, a receive optical subassembly.

3. The optoelectronic module as recited in claim 1, wherein the at least one conductor defines a predetermined angle in cooperation with an axis that is substantially perpendicular to the opposing sides of the flexible substrate.

4. The optoelectronic module as recited in claim 1, wherein the at least one conductor defines opposing sides, each of which is at least flush with a corresponding opposing side of the flexible substrate.

5. The optoelectronic module as recited in claim 1, wherein the at least one conductor substantially comprises gold.

6. The optoelectronic module as recited in claim 1, wherein the flexible substrate substantially comprises a silicone rubber compound.

7. The optoelectronic module as recited in claim 1, wherein the transceiver substrate comprises a printed circuit board.

* * * * *